(12) United States Patent
Lee et al.

(10) Patent No.: US 7,927,897 B2
(45) Date of Patent: Apr. 19, 2011

(54) PHOTORESIST COMPOSITION AND METHOD OF MANUFACTURING ARRAY SUBSTRATE USING THE SAME

(75) Inventors: Hi-Kuk Lee, Yongin-si (KR);
Sang-Hyun Yun, Suwon-si (KR);
Min-Soo Lee, Hwaseong-si (KR);
Deok-Man Kang, Seongnam-si (KR);
Sae-Tae Oh, Pyeongtaek-si (KR);
Jae-Young Choi, Suwon-si (KR)

(73) Assignees: Samsung Electronics Co., Ltd., Suwon-si (KR); AZ Electronic Materials (Japan) K.K., Tokyo (JP)

( * ) Notice: Subject to any disclaimer, the term of this patent is extended or adjusted under 35 U.S.C. 154(b) by 222 days.

(21) Appl. No.: 12/327,215

(22) Filed: Dec. 3, 2008

(65) Prior Publication Data

US 2009/0215233 A1 Aug. 27, 2009

(30) Foreign Application Priority Data

Feb. 26, 2008 (KR) .................. 10-2008-0017354

(51) Int. Cl.
*H01L 21/00* (2006.01)
(52) U.S. Cl. .................. 438/29; 438/694; 257/E21.223; 257/E21.232; 257/E21.257; 257/E21.599; 257/E33.074
(58) Field of Classification Search .................. 438/29, 438/694; 257/21.223, 232, 257, 599, 33.074; 430/270.1, 280.1, 326; 526/266, 270, 280, 526/282
See application file for complete search history.

(56) References Cited

U.S. PATENT DOCUMENTS

| | | | | | |
|---|---|---|---|---|---|
| 5,156,731 | A * | 10/1992 | Ogasawara et al. | ........... | 205/126 |
| 7,132,213 | B2 * | 11/2006 | Masuda et al. | ................ | 430/190 |
| 7,169,532 | B2 * | 1/2007 | Okui et al. | ................ | 430/270.1 |
| 7,208,334 | B2 * | 4/2007 | Asakawa et al. | ................ | 438/29 |
| 7,445,881 | B2 * | 11/2008 | Asakawa et al. | ........... | 430/270.1 |
| 7,514,203 | B2 * | 4/2009 | Moon et al. | ................ | 430/270.1 |
| 7,608,381 | B2 * | 10/2009 | Kinoshita et al. | .......... | 430/270.1 |
| 7,629,035 | B2 * | 12/2009 | Lee et al. | ........................ | 428/1.1 |
| 2006/0166131 | A1 * | 7/2006 | Masuda et al. | ............. | 430/270.1 |
| 2009/0258497 | A1 * | 10/2009 | Park et al. | ...................... | 438/694 |

FOREIGN PATENT DOCUMENTS

| | | |
|---|---|---|
| JP | 2001033951 | 2/2001 |
| JP | 2003342434 | 12/2003 |
| KR | 1020010040651 | 5/2001 |

* cited by examiner

*Primary Examiner* — Michael S Lebentritt
(74) *Attorney, Agent, or Firm* — H.C. Park & Associates, PLC (57) ABSTRACT

A photoresist composition includes a binder resin, a photo acid generator, an acryl resin having four different types of monomers, and a solvent.

6 Claims, 8 Drawing Sheets

PHOTORESIST COMPOSITION AND METHOD OF MANUFACTURING ARRAY SUBSTRATE USING THE SAME

CROSS-REFERENCE TO RELATED APPLICATIONS

This application claims priority from and the benefit of Korean Patent Application No. 10-2008-0017354, filed on Feb. 26, 2008, which is hereby incorporated by reference for all purposes as if fully set forth herein.

BACKGROUND OF THE INVENTION

1. Field of the Invention

The present invention relates to a photoresist composition and a method of manufacturing an array substrate including the same. More particularly, the present invention relates to a photoresist composition used in a photolithography process to manufacture an array substrate and a method of manufacturing the array substrate.

2. Discussion of the Background

Generally, a liquid crystal display (LCD) panel includes a display substrate having a thin-film transistor (TFT) as a switching device driving a pixel, an opposite substrate opposite the display substrate, and a liquid crystal layer between the display substrate and the opposite substrate. The light transmittance of liquid crystal included in the LCD panel may be altered by changing a voltage applied thereto so that the LCD panel may display an image.

The display substrate may be formed by a photolithography process using a photoresist composition. Typically, the photolithography process is a four-mask process, which uses four masks for etching processes, so that the method of manufacturing the display substrate may be simple.

The exposure device used in the photolithography process may include an optical system, and the focus of the optical system depends on a distance between the optical system and a substrate. Thus, maintaining a constant distance between the optical system and the substrate is important. When the distance between the optical system and the substrate changes, the intensity of radiation (light energy) changes. When the intensity differs from that specified by a user, it may not be possible to form a fine photoresist pattern on the substrate.

The photoresist pattern may not be reliably patterned due to physical factors such as the manufacturing precision of a stage supporting the substrate, vibrations when transferring the substrate, manufacturing errors in the optical system of the exposure device, etc. Furthermore, an increased substrate size may decrease the overall reliability of the photoresist patterning.

SUMMARY OF THE INVENTION

The present invention provides a photoresist composition that may improve the exposure margins and thermal resistance of a photoresist pattern including the photoresist composition.

The present invention also provides a method of manufacturing an array substrate including the photoresist composition.

Additional features of the invention will be set forth in the description which follows, and in part will be apparent from the description, or may be learned by practice of the invention.

The present invention discloses a photoresist composition including a binder resin, a photo acid generator, an acryl resin represented by Chemical Formula 1, and a solvent.

<Chemical Formula 1>

In Chemical Formula 1, $R_1$, $R_2$, $R_3$, $R_4$, and $R_5$ each represent a hydrogen atom or an alkyl group having 1-4 carbon atoms, and a, b, d, and e each represent a value in a range of 0.01 to 0.99, and the sum of a, b, d and e is 1.

The present invention also discloses a method of manufacturing an array substrate. A gate line and a gate electrode are formed on a base substrate. A gate insulation layer, an active layer, and a source metal layer are formed on the base substrate having the gate line and the gate electrode. A photoresist film is formed by depositing the above described photoresist composition on the source metal layer. A first photoresist pattern is formed by patterning the photoresist film. The first photoresist pattern includes a source electrode/line region having a first thickness, a drain electrode region having the first thickness, and a channel forming region having a second thickness. The second thickness is thinner than the first thickness. A data line and a channel portion are formed by etching the source metal layer and the active layer using the first photoresist pattern as a mask. A second photoresist pattern is formed by removing the channel forming portion of the first photoresist pattern, and the second photoresist pattern exposes a portion of the source metal layer. A source electrode and a drain electrode are formed by etching the source metal layer using the second photoresist pattern as a mask, and an ohmic contact pattern is formed by etching the active layer using the second photoresist pattern as a mask. A pixel electrode is formed on the base substrate having the drain electrode. The pixel electrode is connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another region, layer, or section.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

A photoresist composition according to an exemplary embodiment of the present invention includes a binder resin, a photo acid generator, an acryl resin represented by Chemical Formula 1, and a solvent.

<Chemical Formula 1>

In Chemical Formula 1, $R_1$, $R_2$, $R_3$, $R_4$, and $R_5$ each represent a hydrogen atom or an alkyl group having 1-4 carbon atoms, and a, b, d, and e each represent a value in a range of about 0.01 to about 0.99, and the sum of a, b, d, and e is 1.

Hereinafter, components of the photoresist composition according to an exemplary embodiment of the present invention will be described.

The binder resin may be soluble in an alkali solution. For example, the binder resin may be prepared by reacting a phenol compound with an aldehyde compound in the presence of an acidic catalyst. A content of the binder resin may be about 1% to about 50% by weight of the photoresist composition.

Examples of the phenol compound may include phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, and isothymol. These may be used alone or in combinations. In some exemplary embodiments of the present invention, a mixture of m-cresol and p-cresol may be used as the phenol compound to control the sensitivity of the photoresist composition. In one exemplary embodiment, a weight ratio of m-cresol to p-cresol may be in a range of about 80:20 to about 20:80. In another exemplary embodiment, the weight ratio may be in a range of about 70:30 to about 50:50.

Examples of the aldehyde compound may include formaldehyde, formalin, p-formaldehyde, trioxane, acetaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, and terephthalic acid aldehyde. These may be used alone or in combinations.

When the content of the binder resin includes less than about 1% by weight of the photoresist composition, the viscosity of the photoresist composition may be excessively low such that the photoresist composition does not form a fine photoresist pattern having a designated thickness. When the content of the binder resin is greater than about 50% by weight of photoresist composition, the viscosity of the photoresist composition may be excessively high such that the photoresist composition may not be coated on a substrate. Thus, in some exemplary embodiments, the content of the binder resin may be about 1% to about 50% by weight of the photoresist composition.

The photo acid generator is provided with light to generate an acid, such as Bronsted acid or Lewis acid. Examples of the photo acid generator may include an onium salt, a halogenated organic compound, a quinone diazide compound, a bis(sulfonyl)diazomethane compound, a sulfone compound, an organic acid-ester compound, an organic acid-amide compound, and an organic acid-imide compound. These may be used alone or in combinations.

Examples of the onium compound may include a diazonium salt, an ammonium salt, an iodonium salt (e.g., diphenyliodonium triflate), a sulfonium salt (e.g., triphenylsulfonium triflate), a phosphonium salt, an arsonium salt, and an oxonium salt. These may be used alone or in combinations.

Examples of the halogenated organic compound may include a halogen-containing oxadiazole compound, a halogen-containing triazine compound, a halogen-containing triazine compound, a halogen-containing acetophenone compound, a halogen-containing benzophenone compound, a halogen-containing sulfoxide compound, a halogen-containing sulfonic compound, a halogen-containing thiazole compound, a halogen-containing oxazole compound, a halogen-containing triazole compound, a halogen-containing 2-pyrone compound, a halogen-containing heterocyclic compound, a halogen-containing aliphatic hydrocarbon, a halogen-containing aromatic hydrocarbon, and a sulfenyl halide compound. These may be used alone or in combinations.

Particularly, examples of the halogenated organic compound may include tris(2,3-dibromopropyl)phosphate, tris(2,3-dibromo-3-chloropropyl)phosphate, tetrabromochlorobutane, 2-[2-(3,4-dimethoxyphenyl)ethenyl]-4,6-bis(trichloromethyl)-S-triazine, hexachlorobenzene, hexabromobenzene, hexabromocyclododecane, hexabromocyclododecene, hexabromobiphenyl, allyltribromophenylether, tetrachlorobisphenol A, tetrabromobisphenol A, bis(chloroethyl)ether of tetrachlorobisphenol A, tetrachlorobisphenol S, tetrabromobisphenol S, bis(2,3-dichloropropyl)ether of tetrachlorobisphenol A, bis(2,3-dibromopropyl)ether of tetrabromobisphenol A, bis(chloroethyl)ether of tetrachlorobisphenol S, bis(bromoethyl)ether of tetrabromobisphenol S, bis(2,3-dichloropropyl)ether of bisphenol S, bis(2,3-dibromopropyl)ether of bisphenol S, tris (2,3-dibromopropyl)isocyanurate, 2,2-bis(4-hydroxy-3,5-dibromophenyl)propane, 2,2-bis(4-(2-hydroxyethoxy)-3,5-dibromophenyl)propane, dichlorodiphenyltrichloroethane, pentachlorophenol, 2,4,6-trichlorophenyl-4-nitrophenylether, 4,5,6,7-tetrachlorophthalide, 1,1-bis(4-chlorophenyl)ethanol, 1,1-bis(4-chlorophenyl)-2,2,2-trichloroethanol, 2,4,4',5-tetrachlorodiphenylsulfide, and 2,4,4',5-tetrachlorodiphenylsulfone. These may be used alone or in combinations.

Examples of the quinone diazide compound may include a sulfonic acid ester of a quinone diazide derivative such as 1,2-benzoquinonediazide-4-sulfonic acid ester, 1,2-naphthoquinonediazide-4-sulfonic acid ester, a sulfonic acid chloride of a quinone diazide derivative such as 1,2-benzoquinone-2-diazide-4-sulfonic acid chloride, 1,2-naphthoquinone-2-diazide-4-sulfonic acid chloride, 1,2-naphthoquinone-2-diazide-5-sulfonic acid chloride, 1,2-naphthoquinone-1-diazide-6-sulfonic acid chloride, or 1,2-benzoquinone-1-diazide-5-sulfonic acid chloride. These may be used alone or in combinations.

Examples of the bis(sulfonyl)diazomethane compound may include α,α'-bis(sulfonyl)diazomethane containing an alkyl group, an alkenyl group, an aralkyl group, an aromatic group, and a heterocyclic group, which may be symmetrically substituted, non-symmetrically substituted, or unsubstituted. These may be used alone or in combinations.

Examples of the sulfone compound may include a sulfone compound and a disulfone compound, which contains an alkyl group, an alkenyl group, an aralkyl group, an aromatic group, and a heterocyclic group, which may be symmetrically substituted, non-symmetrically substituted, or unsubstituted. These may be used alone or in combinations.

Examples of the organic acid ester may include carboxylic acid ester, sulfonic acid ester, and phosphoric acid ester. Examples of the organic acid amide may include carboxylic acid amide, sulfonic acid amide, and phosphoric acid amide. Examples of the organic acid imide may include carboxylic acid imide, sulfonic acid imide, and phosphoric acid imide. These may be used alone or in combinations.

Moreover, examples of the photo acid generator may further include cyclohexylmethyl(2-oxocyclohexyl)sulfonium trifluoromethane sulfonate, dicyclohexylmethyl(2-oxocyclohexyl)sulfonium trifluoromethane sulfonate, 2-oxocyclohexyl(2-norbornyl)sulfonium trifluoromethane sulfonate, 2-cyclohexylsulfonylcyclohexanone, dimethyl(2-oxocyclohexyl)sulfonium trifluoromethane sulfonate, triphenylsulfonium trifluoromethane sulfonate, diphenyliodonium trifluoromethane sulfonate, N-hydroxysuccinimidyl trifluoromethane sulfonate, phenyl p-toluene sulfonate, and α-carbonyl-α-sulfonyldiazomethane containing an alkyl group, an alkenyl group, an aralkyl group, an aromatic group, or a heterocyclic group, which may be symmetrically substituted, non-symmetrically substituted, or unsubstituted. These may be used alone or in combinations.

When a content of the photo acid generator is less than about 1% by weight of the photoresist composition, a photoresist pattern formed from the photoresist composition may not be clear since the amount of acid generated by light exposure may not be sufficient. When the content of the photo acid generator is greater than about 20% by weight of the photoresist composition, a photoresist pattern formed from the photoresist composition may have a round edge or may be damaged in the course of a development process. Thus, in some exemplary embodiments, the content of the photo acid generator may be about 1% to about 20% by weight of the photoresist composition.

The acryl resin represented by Chemical Formula 1 may be prepared by copolymerizing four different types of monomers.

For example, $R_1$, $R_2$, $R_3$, $R_4$, and $R_5$ in Chemical Formula 1 may each represent any one of a hydrogen atom, a methyl group, an ethyl group, a butyl group, and a propyl group.

Each of a, b, d, and e represent a value in a range of about 0.01 to about 0.99, and the sum of a, b, d, and e is 1. For example, in Chemical Formula 1, a may be about 0.5 to about 0.6, b may be about 0.25 to about 0.35, d may be about 0.05 to about 0.15, and e may be about 0.01 to about 0.1.

In one exemplary embodiment, the acryl resin may be represented by the following Chemical Formula 2.

<Chemical Formula 2>

When the content of the acryl resin is less than about 1% by weight of the photoresist composition, the acryl resin may not improve the exposure margins and the thermal resistance of the photoresist pattern formed using the photoresist composition. When the content of the acryl resin is greater than about 20% by weight of the photoresist composition, the adhesion of the photoresist pattern and the substrate may be low and a residual pattern of the photoresist pattern may not be formed on the substrate. Thus, in some exemplary embodiments, the content of the acryl resin may be about 1% to about 20% by weight of the photoresist composition.

A weight average molecular weight of the acryl resin may be about 5,000 to 30,000. The weight average molecular weight denotes a polystyrene-reduced weight-average molecular weight measured by gel permeation chromatography (GPC). When the weight average molecular weight of the acryl resin is less than about 5,000, the acryl resin may not improve the exposure margins and the thermal resistance of the photoresist pattern. When the weight average molecular weight of the acryl resin is greater than about 30,000, the acryl resin may be not soluble in the solvent. In exemplary embodiments, the weight average molecular weight of the acryl resin may be about 16,000.

Examples of the solvent may include alcohols such as methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether, and diethylene glycol dimethyl ether, propylene glycol monoalkyl ethers such as propylene glycol methyl ether, propylene glycol ethyl ether, propylene glycol propyl ether, and propylene glycol butyl ether, propylene glycol alkyl ether acetates such as propylene glycol methyl ether acetate, propylene glycol ethyl ether acetate, propylene glycol propyl ether acetate, and propylene glycol butyl ether acetate, propylene glycol alkyl ether propionates such as propylene glycol methyl ether propionate, propylene glycol ethyl ether propionate, propylene glycol propyl ether propionate, and propylene glycol butyl ether propionate, aromatic compounds such as toluene and xylene, ketones such as methyl ethyl ketone, cyclohexanone, and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate. These may be used alone or in combinations.

In some exemplary embodiments, the photoresist composition may further include a hydroxyl phenol derivative represented by Chemical Formula 3.

<Chemical Formula 3>

In Chemical Formula 1, $R_6$, $R_7$, and $R_8$ each represent an alkyl group having 1-3 carbon atoms. $R_6$, $R_7$, and $R_8$ may include a methyl group, an ethyl group, and a propyl group. In one exemplary embodiment, $R_6$, $R_7$, and $R_8$ may each represent a methyl group.

If the photoresist composition further includes a hydroxyl phenol derivative, the exposure margins and the thermal resistance of the photoresist pattern may be more improved.

When the content of the hydroxyl phenol derivative is less than about 1% by weight of the photoresist composition, the hydroxyl phenol derivative may not improve the exposure margins and the thermal resistance of the photoresist pattern. When the content of the hydroxyl phenol derivative is greater than about 10% by weight of the photoresist composition, the content of the binder resin and the acryl resin is relatively small so that control of the exposure margins and a shape control of the photoresist pattern may be difficult. Thus, in exemplary embodiments, the content of the hydroxyl phenol derivative may be about 1% to about 10% by weight of the photoresist composition.

In addition, in some exemplary embodiments, the photoresist composition further includes additives such as an adhesion promotion agent, a surfactant, an acid diffusion suppressant, and a dye. The content of the additives may be about 1% to about 10% by weight of the photoresist composition.

The adhesion promotion agent may improve an adhesion between a substrate and a photoresist pattern formed from the photoresist composition. Examples of the adhesion promotion agent may include a silane coupling agent containing a reactive substitution group such as a carboxyl group, a methacrylic group, an isocyanate group, or an epoxy group. Particularly, examples of the silane coupling agent may include γ-methacryloxypropyl trimethoxy silane, vinyl triacetoxy silane, vinyl trimethoxy silane, γ-isocyanate propyl triethoxy silane, γ-glycidoxy propyl trimethoxy silane, and β-(3,4-epoxy cyclohexyl)ethyl trimethoxy silane. These may be used alone or in combinations.

The surfactant may improve coating characteristics and development characteristics of the photoresist composition. Examples of the surfactant may include polyoxyethylene octylphenylether, polyoxyethylene nonylphenylether, F171, F172, F173 (trade name, manufactured by Dainippon Ink in Japan), FC430, FC431 (trade name, manufactured by Sumitomo 3M in Japan), and KP341 (trade name, manufactured by Shin-Etsu Chemical in Japan). These may be used alone or in combinations.

The acid diffusion suppressant may prevent an acid from diffusing into an area that is not exposed to light. Examples of the photosensitizer may include an amine, ammonium hydroxide, and a photosensitive base. Particularly, examples of acid diffusion suppressant may include tetrabutylammonium hydroxide, triethanolamine, diethanolamine, trioctylamine, n-octylamine, trimethylsulfonium hydroxide, and triphenylsulfonium hydroxide. These may be used alone or in combinations.

The dye may serve to control the contrast of a photoresist pattern. The dye may be selected in view of solubility and heat resistance. Examples of the dye may include a pyrazoleazo-based dye, an anilinoazo-based dye, an arylazo-based dye, a triphenylmethane-based dye, an anthraquinone-based dye, an anthrapyridone-based dye, a benzylidene-based dye, an oxonol-based dye, a pyrazoletriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, and an indigo-based dye. These may be used alone or in combinations.

According to the above, a photoresist composition may not be affected as much by changes in the depth of focus (DOF) of an optical system. The DOF may be defined by a distance capable of forming a fine photoresist pattern, the distance between the optical system of the exposure device and the substrate. This increases a range of forming a fine photoresist pattern. Although a distance between the optical system of an exposure device and a substrate changes so the focus of the optical system changes, the photoresist composition may still form a fine photoresist pattern. Therefore, forming a photoresist pattern using the photoresist composition may not be affected by the focus of the optical system, which may vary due to physical factors such as the manufacturing precision of a stage supporting the substrate, vibrations when transferring the substrate, and manufacturing errors in the optical system of the exposure device. Thus, the exposure margins of the photoresist pattern may be improved.

Furthermore, the thermal resistance of the photoresist pattern may be improved, and the reliability of manufacturing a thin-film transistor (TFT) by the four-mask process may be improved.

Hereinafter, a method of manufacturing an array substrate according to an exemplary embodiment of the present invention will be described more fully with reference to the accompanying drawings.

Method of Manufacturing an Array Substrate

Figure 1:
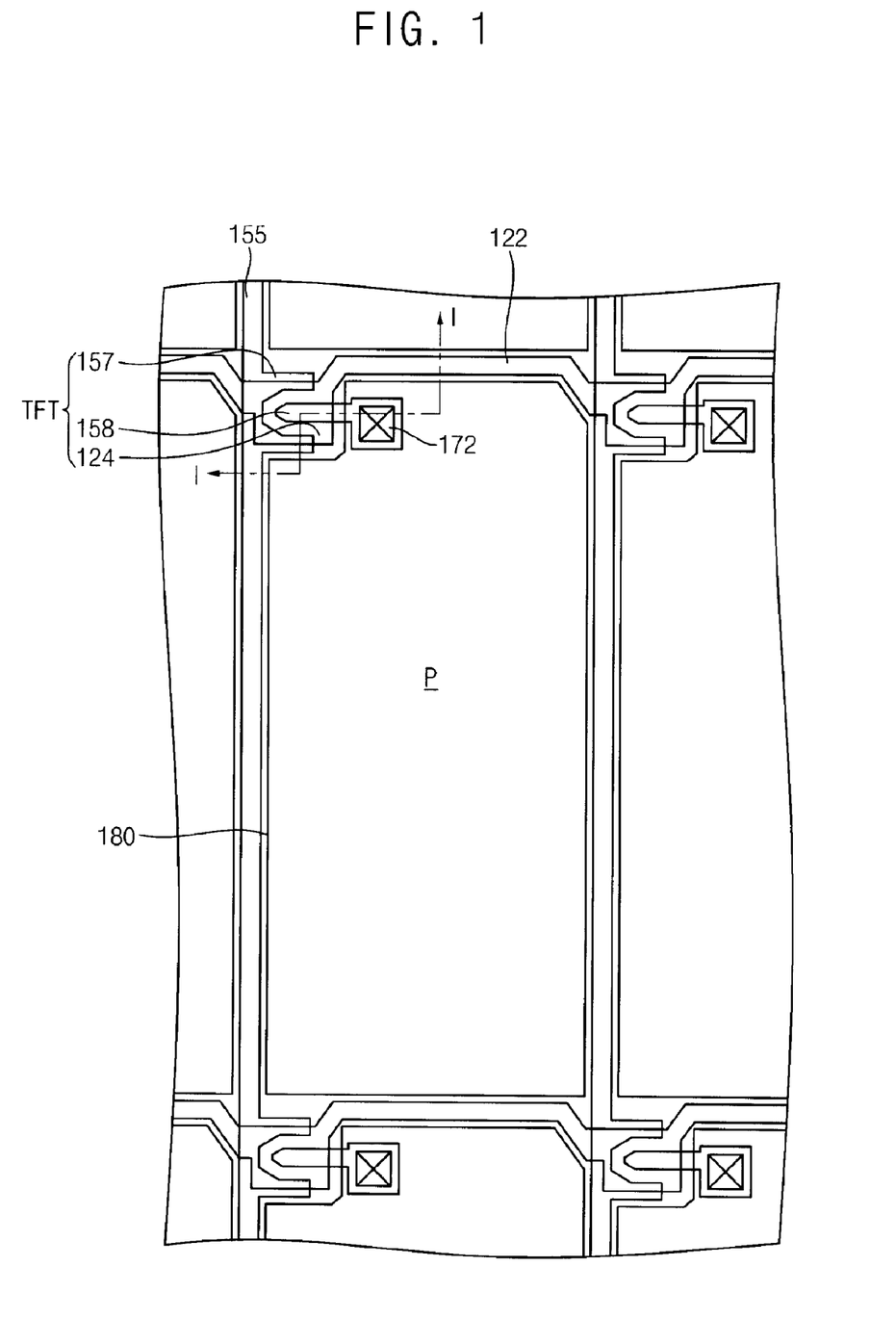
FIG. 1 is a plan view showing an array substrate according to an exemplary embodiment of the present invention.

FIG. 1 is a plan view showing an array substrate according to an exemplary embodiment of the present invention. FIG. 2, FIG. 3, FIG. 4, FIG. 5, FIG. 6, FIG. 7, and FIG. 8 are cross-sectional views showing a method of manufacturing the array substrate of FIG. 1. Particularly, FIG. 2, FIG. 3, FIG. 4, FIG. 5, FIG. 6, FIG. 7, and FIG. 8 respectively show a cross-section taken along line I-I' of FIG. 1.

Figure 2:
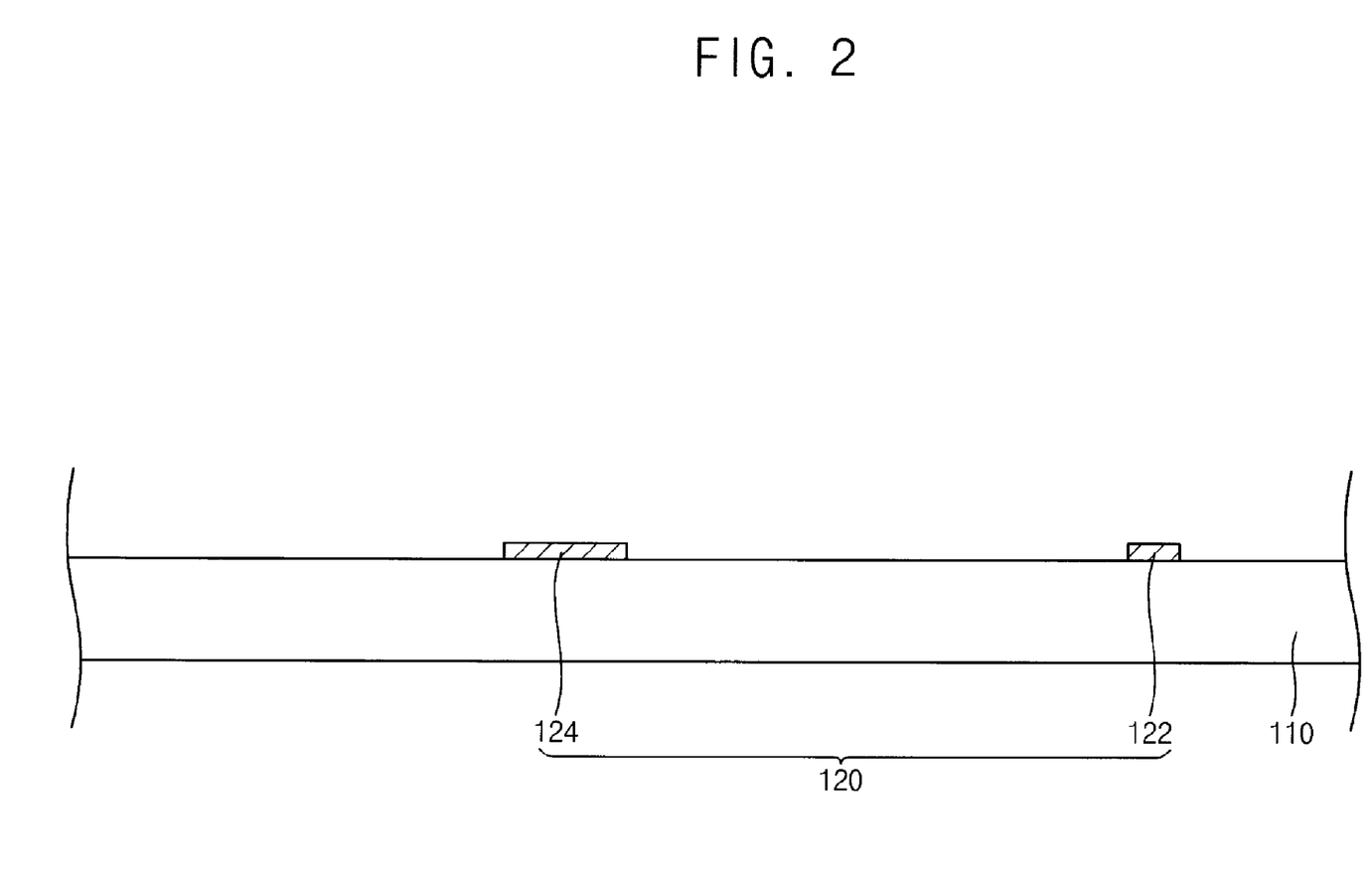
FIG. 2, FIG. 3, FIG. 4, FIG. 5, FIG. 6, FIG. 7, and FIG. 8 are cross-sectional views showing a method of manufacturing the array substrate of FIG. 1.

Referring to FIG. 1 and FIG. 2, a gate metal layer (not shown) is formed on a base substrate 110, and then the gate metal layer is patterned through a photolithography process using a first exposure mask (not shown) to form a gate pattern 120.

The gate pattern 120 includes a gate line 122 and a gate electrode 124 connected to the gate line 122. The gate line 122 may extend in one direction on the base substrate 110, and a plurality of the gate lines 122 may be arranged parallel to each other. The gate electrode 124 is connected to the gate line 122 and serves as a gate terminal of a TFT for a switching device formed in a pixel P.

The base substrate 110 may be a transparent insulation substrate. An example of a material that may be used for the base substrate 110 is glass.

For example, the gate metal layer may be formed by a sputtering process on the base substrate 110. The gate pattern 120 may be formed by wet etching process. Examples of a material that may be used for the gate pattern 120 may include aluminum (Al), molybdenum (Mo), neodymium (Nd), chromium (Cr), tantalum (Ta), titanium (Ti), tungsten (W), copper (Cu), silver (Ag), or an alloy thereof. The gate pattern 120 may have a double-layer structure including at least two metal layers having different physical characteristics. For example, the gate pattern 120 may have an Al/Mo double-layer structure including an Al layer and a Mo layer so as to reduce resistance.

Figure 3:
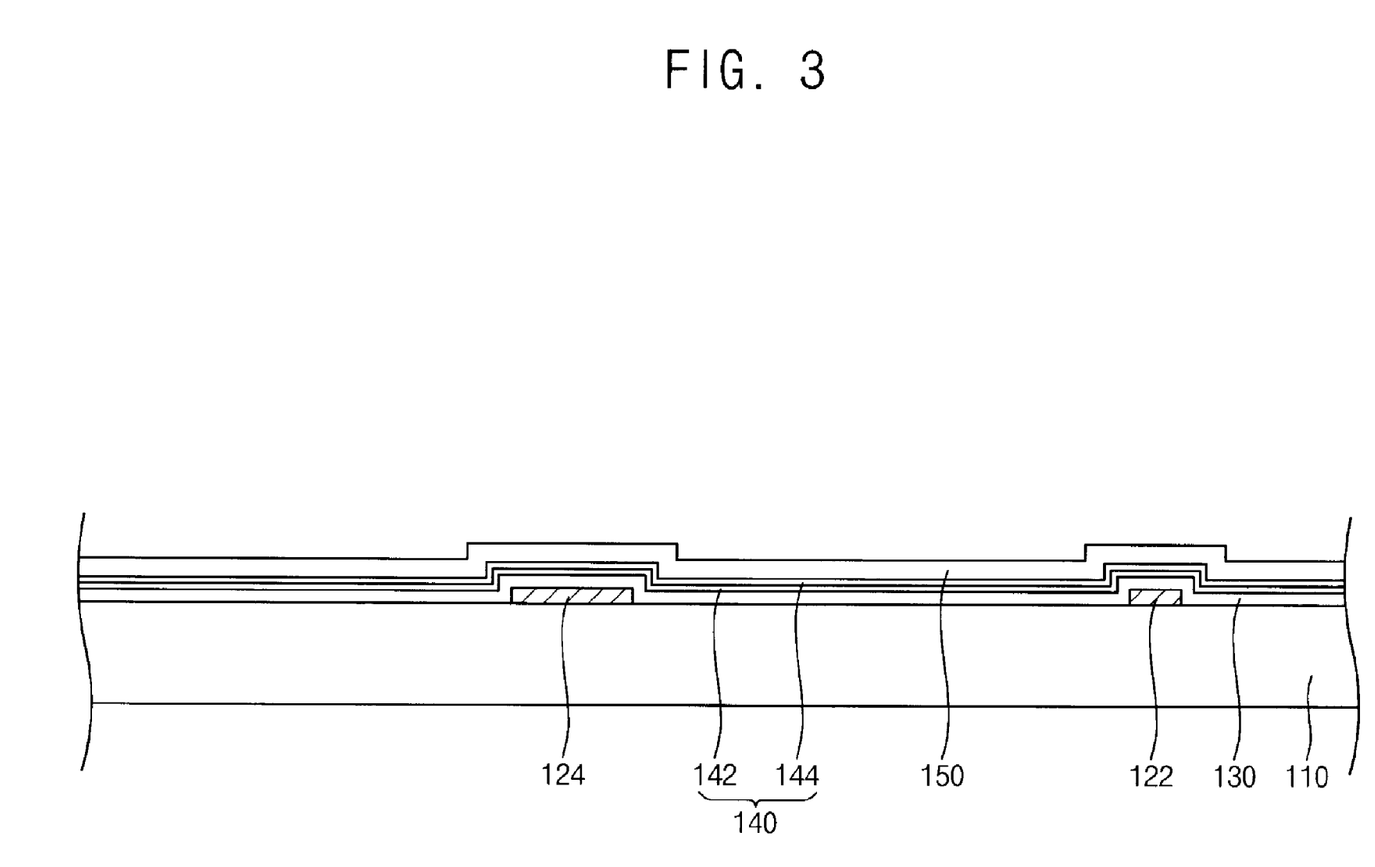

Referring to FIG. 3, a gate insulation layer 130 and an active layer 140 are sequentially formed on the base substrate 110 having the gate pattern 120. The gate insulation layer 130 and the active layer 140 may be formed by plasma-enhanced chemical vapor deposition (PECVD) in one exemplary embodiment.

The gate insulation layer 130 may protect and insulate the gate pattern 120. Examples of a material that may be used for the gate insulation layer 130 may include silicon nitride and silicon oxide. For example, a thickness of the gate insulation layer 130 may be about 4,500 Å.

The active layer 140 includes a semiconductor layer 142 and an ohmic contact layer 144. An example of a material that may be used for the semiconductor layer 142 may is amorphous silicon, and an examples of a material that may be used for the ohmic contact layer 144 is amorphous silicon into which $n^+$ impurities are implanted at a high concentration.

A source metal layer 150 is formed on the active layer 140. In one example, the source metal layer 150 may have a Mo/Al/Mo triple-layer structure to reduce the resistance of the source metal layer 150. Alternatively, the source metal layer 150 may have a single layer including Mo or Al.

Figure 4:
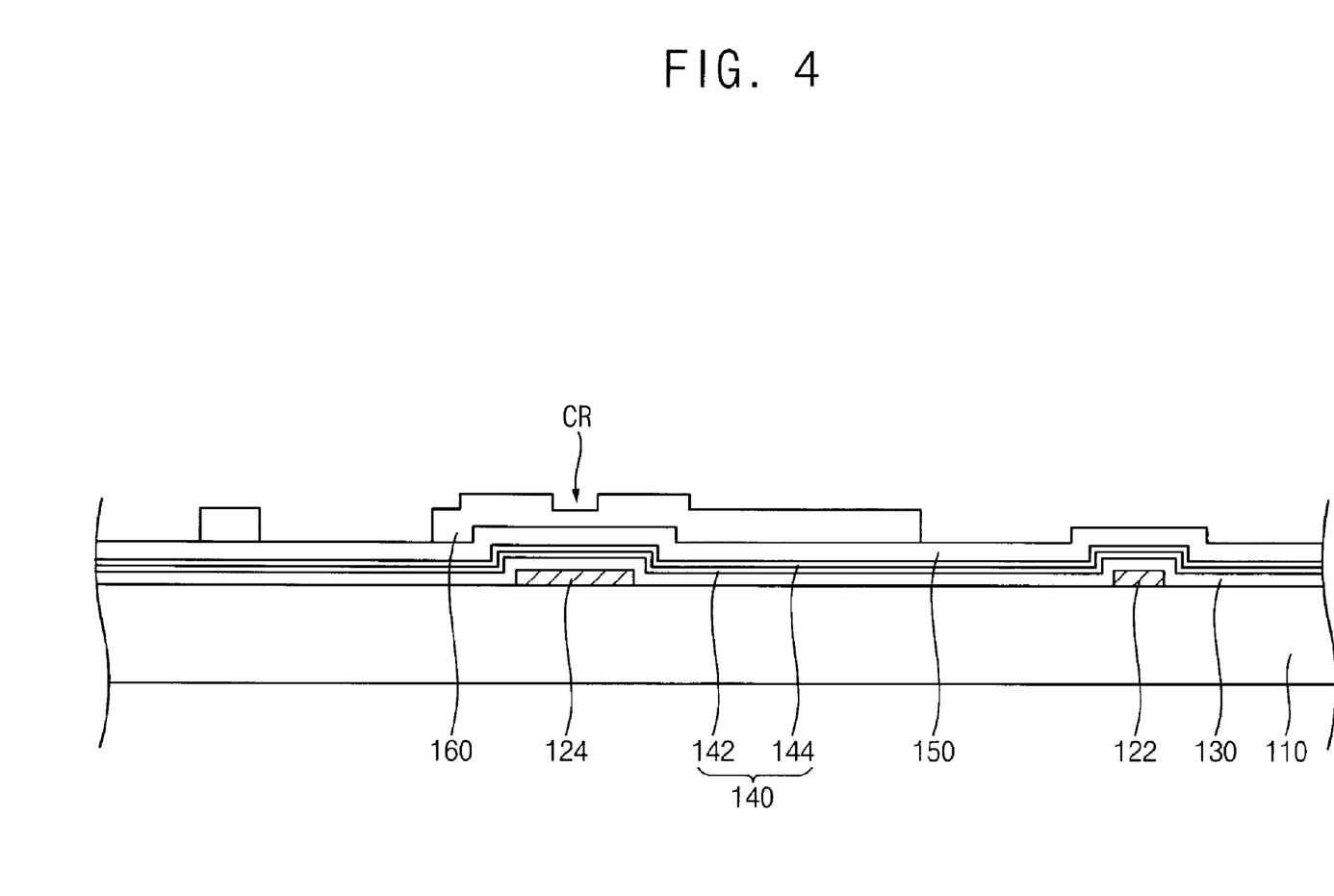

Referring to FIG. 4, a photoresist composition is coated on the source metal layer 150 to form a photoresist film (not shown). The photoresist film is exposed to light by a second exposure mask (not shown), such as a slit mask or a halftone mask, and then developed to form a first photoresist pattern 160.

The photoresist composition includes a binder resin, a photo acid generator, an acryl resin represented by Chemical Formula 1, and a solvent.

<Chemical Formula 1>

In Chemical Formula 1, $R_1$, $R_2$, $R_3$, $R_4$, and $R_5$ each represent a hydrogen atom or an alkyl group having 1-4 carbon atoms, and a, b, d, and e each represent a value in a range of about 0.01 to about 0.99, and the sum of a, b, d, and e is 1.

The photoresist composition is substantially the same composition as in exemplary embodiments of the present invention described above. Thus, any further description will be omitted.

The first photoresist pattern 160 includes a source electrode/line region having a first thickness, a drain electrode region having the first thickness, and a channel forming region having a second thickness. The channel forming region is formed on a channel forming area CR of the base substrate 110. The second thickness is thinner than the first thickness. The channel forming region of the first photoresist pattern 160 is formed by partially exposing light through a slit portion or a halftone portion of the first exposure mask. After the source metal layer 150 is etched using the first photoresist pattern 160, a remaining source metal layer forms a source electrode (157, see FIG. 7) and a source line (155, see FIG. 5) under the source electrode/line region of the first photoresist pattern 160 and a drain electrode (158, see FIG. 7) under the drain electrode region of the first photoresist pattern 160.

Figure 5:
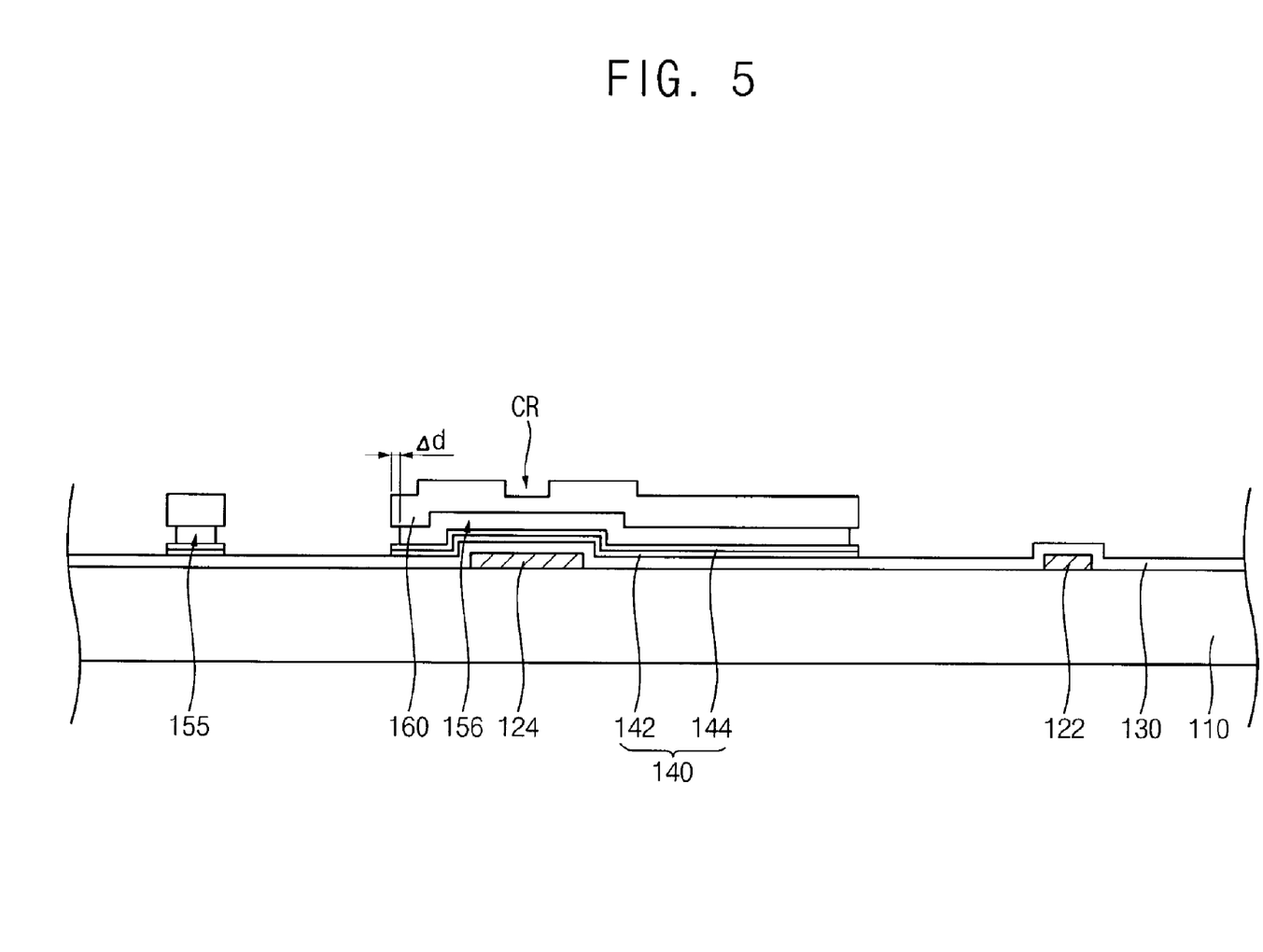

Referring to FIG. 1 and FIG. 5, the source metal layer 150 is etched using the first photoresist pattern as etching preventing layer. For example, the source metal layer 150 may be etched by a wet etching process.

After the source metal layer 150 is etched by the wet etching process using the first photoresist pattern 160, the source line 155 and a source/drain metal pattern 156 remain on the base substrate 110. The source line 155 may extend parallel to the gate line 122 on the base substrate 110, and a plurality of the source lines 155 may be arranged parallel each other. Since the source metal layer 150 is etched by the wet etching process, an edge of the source line 155 and an edge of the source/drain metal pattern 156 may coincide with an edge of the first photoresist pattern 160 to form an undercut having a width Δd.

Thereafter, the active layer 140 is etched using the first photoresist pattern 160 as an etching prevention mask. For example, the active layer 140 may be etched by a dry etching process. After the active layer 140 is etched, a remaining semiconductor layer 142 forms a channel portion (146, see FIG. 7) and a remaining ohmic contact layer 144 forms a pair of ohmic contact patterns (148, see FIG. 7).

Figure 6:
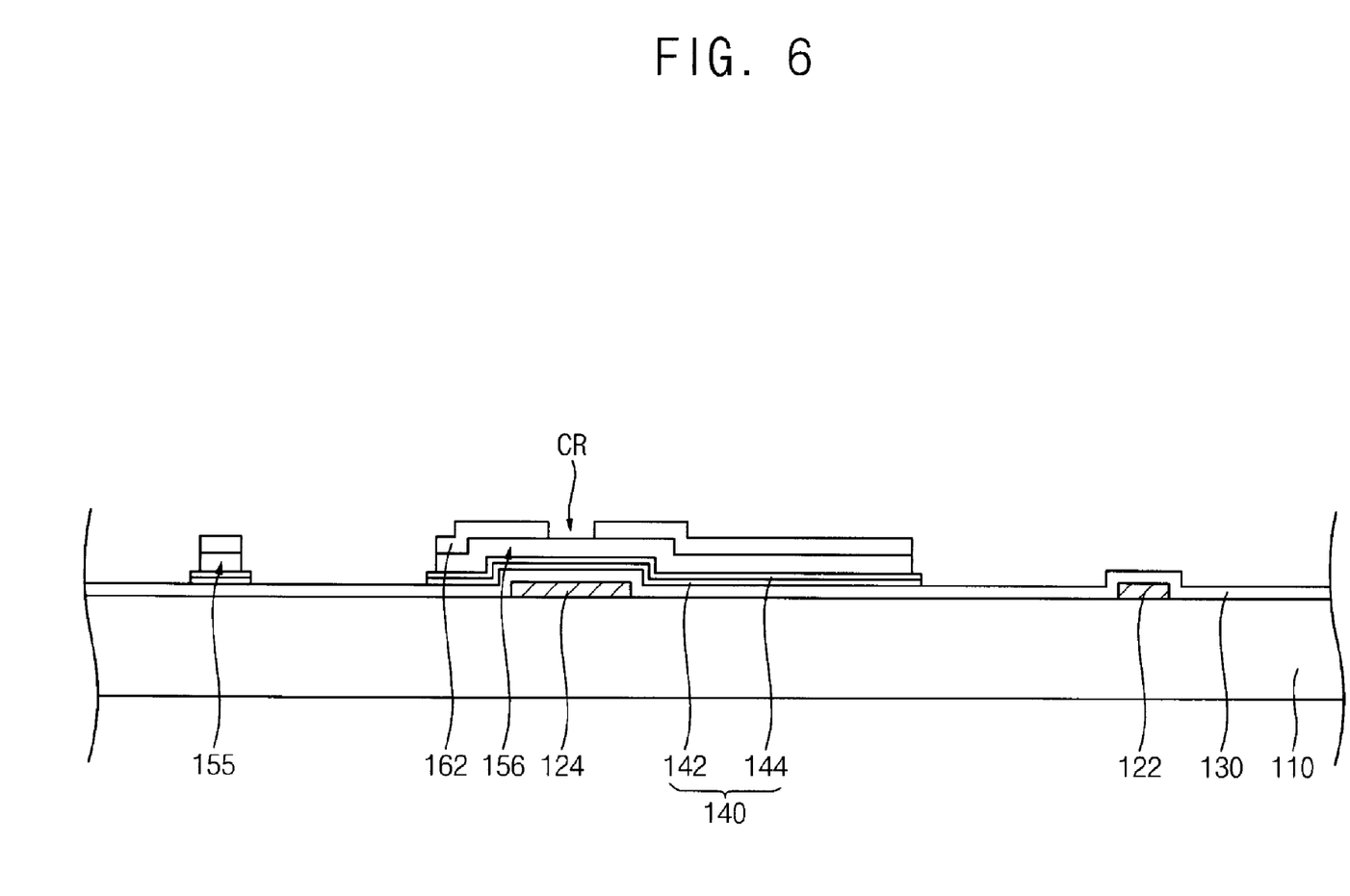

Referring to FIG. 5 and FIG. 6, a second photoresist pattern 162 is formed by removing the channel forming region forming on the channel forming area CR. Thus, the source/drain metal pattern 156 forming on the channel forming area CR is exposed through the second photoresist pattern 162.

Alternatively, the active layer 140 may be etched after the second photoresist pattern 162 is formed. Thus, the active layer 140 may be etched using the source/drain metal pattern 156 and the second photoresist pattern 162 as an etching prevention mask.

Figure 7:
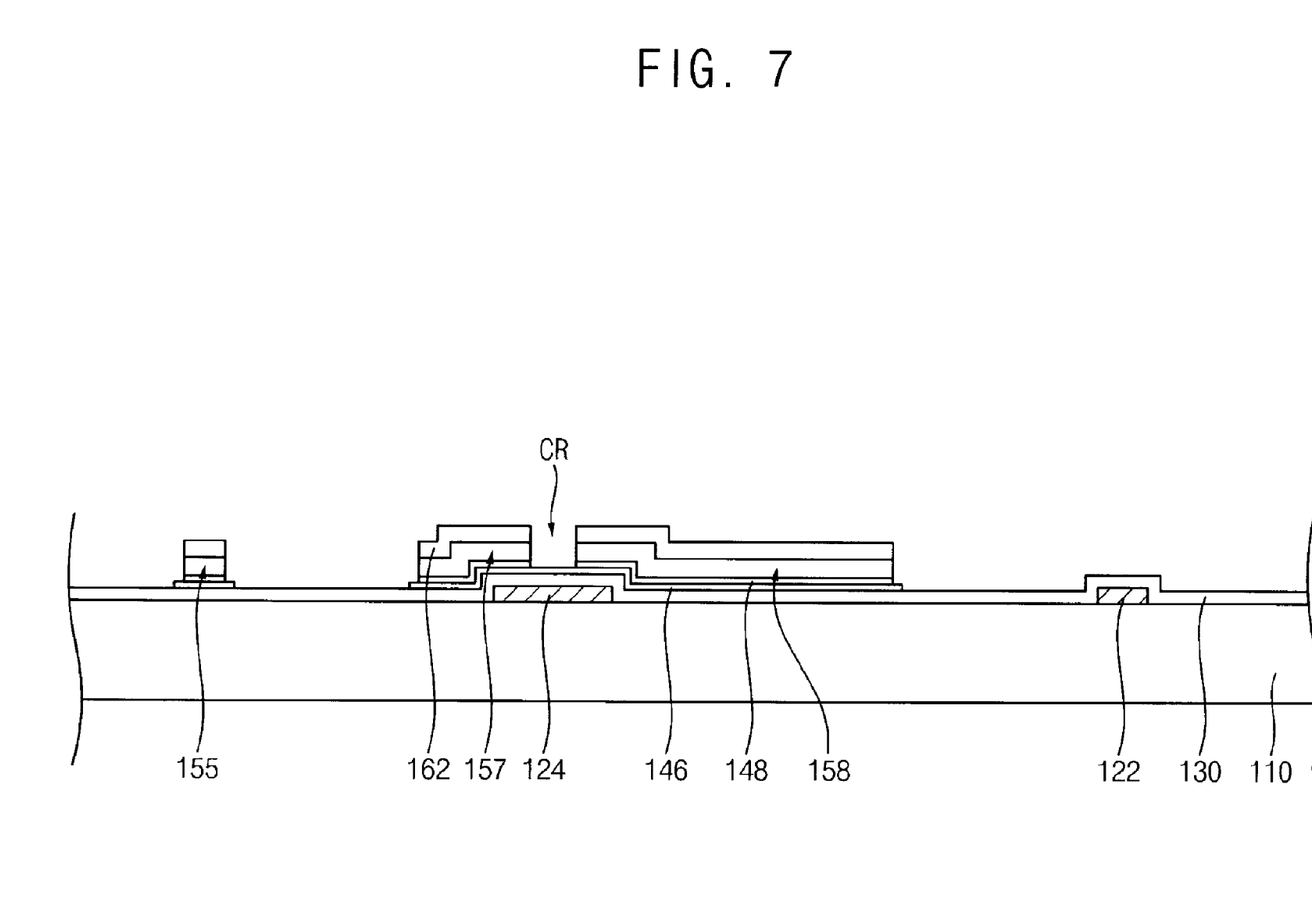

Referring to FIG. 1 and FIG. 7, the source electrode 157 and the drain electrode 158 are formed by etching the source/drain metal pattern 156 formed on the channel forming area CR and exposed through the second photoresist pattern 162. For example, the source/drain metal pattern 156 may be etched by a wet etching process.

The source electrode 157 is connected to the source line 155, and serves as a source terminal of the TFT. The drain electrode 158 is spaced apart from the source electrode 157 and serves as a drain terminal of the TFT.

Thereafter, an exposed portion of the ohmic contact layer 144 is etched using the second photoresist pattern 162 as a mask to form a pair of ohmic contact patterns 148. The exposed portion of the ohmic contact layer 144 is a portion of the ohmic contact layer 144 formed on the channel forming area CR of the base substrate 110. The ohmic contact patterns 148 are spaced apart from each other. The second photoresist pattern 162 is removed from the base substrate 110. For example, the second photoresist pattern 162 may be removed by a stripping process using a stripping solution. Thus, the TFT having a channel is formed on the base substrate 110. The channel may be a portion between the source electrode 157 and the drain electrode 158, and the channel is formed on the channel forming area CR of the base substrate 110.

Figure 8:
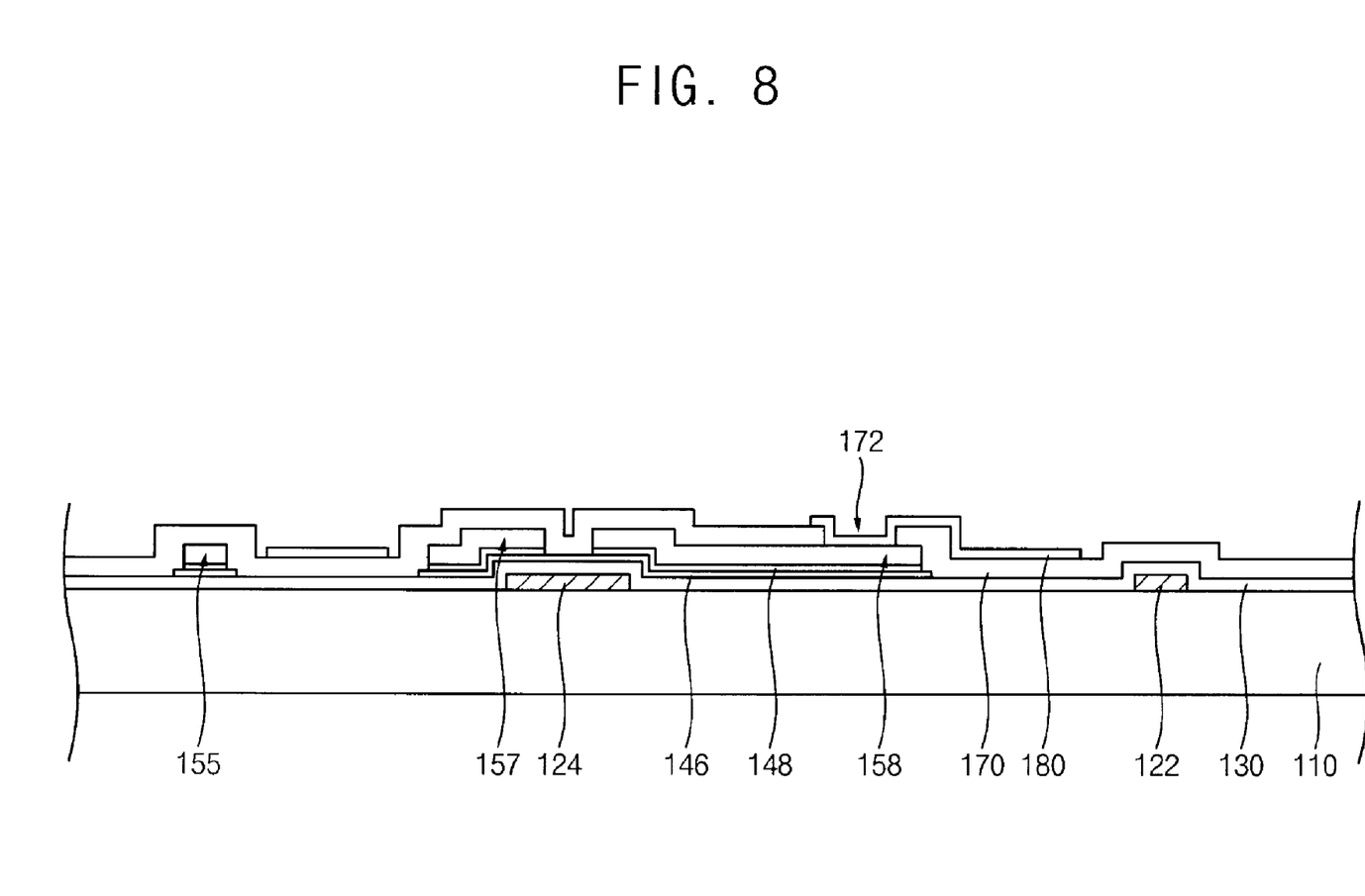

Referring to FIG. 1 and FIG. 8, a passivation layer 170 is formed on the base substrate 110 having the TFT. The passivation layer 170 protects and insulates the TFT and the data line 155. Examples of a material that may be used for the passivation layer 170 may include silicon nitride, silicon oxide, etc. For, example, the passivation layer 170 may be formed through a chemical vapor deposition (CVD) method, and a thickness of the passivation layer 170 may be about 500 Å to about 2,000 Å.

The passivation layer 170 is patterned through a photolithography process using a third exposure mask (not shown) to form a contact hole 172 exposing a portion of the drain electrode 158.

After the contact hole 172 is formed, a transparent conductive layer is formed on the passivation layer 170. The transparent conductive layer is patterned through a photolithography process using a fourth exposure mask (not shown) to form a pixel electrode 180 in the pixel P. The pixel electrode 180 is connected to the drain electrode 158 through the contact hole 172. Examples of a material that may be used for the pixel electrode 180 may include indium zinc oxide (IZO) and indium tin oxide (ITO).

Alternatively, before the pixel electrode 180 is formed, an organic insulation layer (not shown) may be formed on the passivation layer 170 to planarize the base substrate 110.

The photoresist composition and the method of manufacturing an array substrate according to exemplary embodiments of the present invention will be further described hereinafter through Examples and Comparative Examples.

Preparation of a Photoresist Composition

Example 1

A phenol mixture including m-cresol and p-cresol in a weight ratio of about 50:50 was reacted with formaldehyde to prepare a novolak resin as a binder resin, of which a weight average molecular weight was about 8,000. About 2% by weight of an acryl resin represented by Chemical Formula 3, about 8% by weight of the binder resin, about 5% by weight of 1,2-naphtoquinondiazide-4-sufonic ester as a photo acid generator, and about 85% by weight of propylene glycol methyl ether acetate as a solvent were mixed with each other to prepare a photoresist composition.

Example 2

A phenol mixture including m-cresol and p-cresol in a weight ration of about 50:50 was reacted with formaldehyde to prepare a novolak resin as a binder resin, of which a weight average molecular weight was about 8,000. About 2% by weight of an acryl resin represented by Chemical Formula 3, about 2% by weight of a hydroxyl phenol derivate represented by Chemical Formula 4, about 8% by weight of the binder resin, about 5% by weight of 1,2-naphtoquinondiazide-4-sufonic ester as a photo acid generator, and about 83% by weight of propylene glycol methyl ether acetate as a solvent were mixed with each other to prepare a photoresist composition.

<Chemical Formula 4>

Comparative Example 1

A phenol mixture including m-cresol and p-cresol in a weight ration of about 50:50 was reacted with formaldehyde to prepare a novolak resin as a binder resin, of which a weight average molecular weight was about 8,000. About 10% by weight of the binder resin, about 5% by weight of 1,2-naphtoquinondiazide-4-sufonic ester as a photo acid generator, and about 85% by weight of propylene glycol methyl ether acetate as a solvent were mixed with each other to prepare a photoresist composition.

Evaluation of a photoresist pattern formed using a photoresist composition

The compositions prepared in Examples 1 and 2 and Comparative Example 1 were each spread on a substrate to form a photoresist film. A mask was disposed on the photoresist film, and the photoresist film was exposed by ultra violet light in changing focus of an optical system of an exposure device.

<Chemical Formula 3>

After an exposed photoresist film was developed using an alkali solution and baked on high temperature so that a photoresist pattern was formed on the substrate, a shape of the photoresist pattern was observed through an electron microscope. The obtained results are shown in Table 1 and Table 2.

TABLE 1

|  | Depth of Focus (DOF) |
| --- | --- |
| Example 1 | About 20 μm |
| Example 2 | About 25 μm |
| Comparative Example 1 | About 15 μm |

TABLE 2

|  | Breakdown temperature of a photoresist pattern |
| --- | --- |
| Example 1 | Over about 130° C. |
| Example 2 | Over about 135° C. |
| Comparative Example 1 | Over about 120° C. |

The DOF may be defined by a distance capable of forming a fine photoresist pattern, the distance between the optical system of the exposure device and the substrate. In Table 1, the DOF represents a maximum of the distance.

Referring to Table 1, a DOF of the photoresist pattern according to Example 1 is about 20 µm, a DOF of the photoresist pattern according to Example 2 is about 25 µm, and a DOF of the photoresist pattern according to Comparative Example 1 is about 15 µm. Although a focus of the optical system is changed, the range of forming the fine photoresist pattern is wide. Therefore, forming the photoresist pattern including the photoresist composition may not depend on the focus of the optical system, which is changed by physical factors such as the manufacturing precision of a stage supporting the substrate, vibrations when transferring the substrate, and manufacturing errors of the optical system of the exposure device.

Referring to Table 2, a breakdown temperature of a photoresist pattern according to Example 1, which includes the acryl resin represented by Chemical Formula 3, is higher than a breakdown temperature of a photoresist pattern according to Comparative Example 1, which does not include the acryl resin. In other words, a thermal resistance of the photoresist pattern according to Example 1 is better than a thermal resistance of the photoresist pattern according to Comparative Example 1.

Moreover, a breakdown temperature of a photoresist pattern according to Example 2, which further includes the hydroxyl phenol derivative represented by Chemical Formula 4, is higher than the breakdown temperatures of the photoresist patterns according to Example 1 and Comparative Example 1.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate, comprising:

forming a gate line and a gate electrode on a base substrate;

forming a gate insulation layer, an active layer, and a data metal layer on the base substrate formed the gate line and the gate electrode;

forming a photoresist film using a photoresist composition comprising a binder resin, a photo acid generator, an acryl resin represented by Chemical Formula 1, and a solvent, the photoresist film formed on the data metal layer;

forming a first photoresist pattern by patterning the photoresist film, the first photoresist pattern comprising a source electrode/line portion having a first thickness, a drain electrode portion having the first thickness, and a channel forming portion having a second thickness;

forming a data line and a channel portion by etching the data metal layer and the active layer using the first photoresist pattern as a mask;

forming a second photoresist pattern by removing the channel forming portion of the first photoresist pattern, the second photoresist pattern exposing a portion of the data metal layer;

forming a source electrode and a drain electrode by etching the data metal layer using the second photoresist pattern as a mask; and forming an ohmic contact pattern by etching the active layer using the second photoresist pattern as a mask,

<Chemical Formula 1> wherein $R_1$, $R_2$, $R_3$, $R_4$, and $R_5$ each represent a hydrogen atom or an alkyl group having 1-4 carbon atoms, and a, b, d, and e each represent a value in a range of about 0.01 to about 0.99, and the sum of a, b, d, and e is 1.

2. The method of claim 1, wherein a is about 0.5 to about 0.6, b is about 0.25 to about 0.35, d is about 0.05 to about 0.15, and e is about 0.01 to about 0.1.

3. The method of claim 2, wherein the acryl resin is represented by Chemical Formula 2, <Chemical Formula 2>

4. The method of claim 1, further comprising a hydroxyl phenol derivative represented by Chemical Formula 3, <Chemical Formula 3> wherein $R_6$, $R_7$, and $R_8$ each represent an alkyl group having 1-3 carbon atoms.

5. The method of claim 4, wherein $R_6$, $R_7$, and $R_8$ each represent a methyl group.

6. The method of claim 1, wherein a weight average molecular weight of the acryl resin is about 5,000 to about 30,000.

* * * * *